(12) United States Patent
Inomata et al.

(10) Patent No.: US 7,385,790 B2
(45) Date of Patent: Jun. 10, 2008

(54) CPP-TYPE GIANT MANETORESISTANCE EFFECT ELEMENT AND MAGNETIC COMPONENT AND MAGNETIC DEVICE USING IT

(75) Inventors: Kouichiro Inomata, Miyagi (JP); Nobuki Tezuka, Miyagi (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 423 days.

(21) Appl. No.: 10/544,007

(22) PCT Filed: Jan. 23, 2004

(86) PCT No.: PCT/JP2004/000594

§ 371 (c)(1),
(2), (4) Date: Aug. 1, 2005

(87) PCT Pub. No.: WO2004/068607

PCT Pub. Date: Aug. 12, 2004

(65) Prior Publication Data

US 2006/0139817 A1 Jun. 29, 2006

(30) Foreign Application Priority Data

Jan. 31, 2003 (JP) ............................ 2003-024981
May 15, 2003 (JP) ............................ 2003-137945

(51) Int. Cl.
 *G11B 5/39* (2006.01)
(52) U.S. Cl. .................................... 360/324.1
(58) Field of Classification Search ............. 360/324.1, 360/324.11, 324.2, 319; 428/692
See application file for complete search history.

(56) References Cited

U.S. PATENT DOCUMENTS

| 6,445,552 B1* | 9/2002 | Gill ........................... 360/319 |
| 6,611,405 B1* | 8/2003 | Inomata et al. .......... 360/324.2 |
| 6,876,527 B2* | 4/2005 | Gill ....................... 360/324.12 |
| 6,992,869 B2* | 1/2006 | Suzuki et al. ............ 360/324.2 |
| 2002/0034055 A1* | 3/2002 | Seyama et al. ........ 360/324.11 |
| 2002/0081458 A1* | 6/2002 | Hasegawa et al. .......... 428/692 |
| 2003/0011364 A1 | 1/2003 | Hosomi et al. |
| 2003/0011945 A1 | 1/2003 | Yuasa et al. |

FOREIGN PATENT DOCUMENTS

| EP | 1 085 586 A2 | 3/2001 |
| JP | 9-251621 | 9/1997 |
| JP | 2002-124712 | 4/2002 |
| JP | 2002-359415 | 12/2002 |
| JP | 2003-298142 | 10/2003 |

OTHER PUBLICATIONS

K. Inomata et al.; "Magnetic switching field and giant magnetoresistance effect of multilayers with synthetic antiferromagnet free layers". Applied Physics Letters, vol. 81, No. 2, Jul. 8, 2002, pp. 310-312. (Cited in the int'l. search report).

N. Tezuka et al.; "Single domain observation for synthetic antiferromagnetically coupled bits with low aspect ratios", Applied Physics Letters, vol. 82, No. 4, Jan. 27, 2003, pp. 604-606. (Cited in the int'l. search report).

K. Eid et al.; "Current-perpendicular-to-plane-magnetoresistance properties of Ru and Co/Ru interfaces", Journal of Applied Physics, vol. 91, No. 10, May 15, 2002, pp. 8102-8104.

Translation of International Preliminary Report on Patentability of International Application No. PCT/JP 2004/000594, with Form PCT/IB/338.

* cited by examiner

*Primary Examiner*—Tianjie Chen
(74) *Attorney, Agent, or Firm*—Westerman, Hattori, Daniels & Adrian, LLP.

(57) ABSTRACT

Disclosed is a CPP type giant magnetoresistance device (10, 20, 50) capable of exhibiting a giant magnetoresistance effect by spin dependent current in a direction perpendicular to a film plane as well as magnetic components and units using the device. The CPP type giant magnetoresistance device has a multi-layered structure of an antiferromagnetic layer (9), a ferromagnetic fixed layer (11, 11A), a nonmagnetic conductive layer (12) and a ferromagnetic free layer (13, 13A) wherein the ferromagnetic free layer (13, 13A) has a first magnetic layer (14, 14A) and a second magnetic layer (16, 16A) magnetically coupled together antiparallel to each other via a magnetic coupler (15, 15A) and formed to have different magnitudes of magnetization (17, 17'; 18, 18A) from each other. Electrons (5) with upward spin and electrons (6) with downward spin are scattered spin-dependently according to orientations in magnetization of the ferromagnetic fixed layer (11, 11A) and the ferromagnetic free layer (13, 13A) and are allowed to trace paths (1, 2, 3, 4) whereby the CPP-GMR is increased. Also, in a CPP type giant magnetoresistance device (30) having a ferromagnetic fixed layer (11), a nonmagnetic conductive layer (12) and a ferromagnetic free layer (13A), there may be a layer (21) made of one or more of ruthenium, iridium, rhodium, rhenium and chromium between the ferromagnetic fixed layer (11) and the nonmagnetic conductive layer (12) and/or on a surface of the ferromagnetic free layer (13A).

25 Claims, 10 Drawing Sheets

(a)

(b)

(c)

CPP-TYPE GIANT MANETORESISTANCE EFFECT ELEMENT AND MAGNETIC COMPONENT AND MAGNETIC DEVICE USING IT

TECHNICAL FIELD

The present invention relates to a giant magnetoresistance device that exhibits a giant magnetoresistance effect by spin dependent current in a direction perpendicular to a film plane (hereinafter referred to as "CPP type giant magnetoresistance device") and also to magnetic components and units using the same.

BACKGROUND ART

In recent years there has been developed a giant magnetoresistance (GMR) effect device that is made of a ferromagnetic layer, a nonmagnetic metal layer and a ferromagnetic layer laid adjacent one to another. The GMR is due to spin dependent scattering at an interface and is based on the fact that two ferromagnetic layers, when their magnetizations are switched to orient parallel or antiparallel to each other on controlled application of external magnetic filed, have a change in electrical resistance.

GMR devices have already been put to practical use as in magnetic sensors and reproducing heads in hard disk drives. Then, current is passed in a film plane, when the GMR device is called "CIP-GMR" device where CIP stands for Current In Plane. The CIP-GMR device generally makes use of an element called what is of spin valve in which an antiferromagnet is brought adjacent to one of the ferromagnets to fix spins in the one ferromagnet. On the other hand, there has also been known a GMR device called what is of "CPP" (which stands for Current Perpendicular to the Plane) type in which current is passed in a direction perpendicular to a film plane.

It is further known that generally CPP-GMR is greater in magnitude than CIP-GMR. Using such CPP-GMR, there is the proposed development to a CPP-type giant magnetoresistive effect device in which spiral magnetic domains generated by a sense current in a free magnetic layer are controlled to develop and then to a reproducing head using the device. See, the Japanese laid open patent application, for example, JP 2002-359415 A.

There are also proposals to apply a spin valve structure to a densified recording head to improve its head characteristics. See the Japanese laid open patent application, for example, JP 2002-124721 A.

There is also a proposal by the present inventors for a three-layer structure having antiparallel magnetizations identical in magnitude. See the Japanese laid open patent application, JP H09-251621 A.

A CPP-GMR device so far proposed is small in resistance, however, since its current path is small. Being poor in utility unless it is made enough smaller, the device has not yet been put to practical use.

Although in the CPP-GMR device, too, the spin valve type has been considered having an antiferromagnetic layer 81 brought adjacent to a ferromagnetic fixed layer 82 as shown in FIG. 10, the antiferromagnetic layer 81 is larger in resistance than a GMR film made of a ferromagnetic free layer 84, a nonmagnetic conductive layer 83 and the ferromagnetic fixed layer 82 to an extent that the spin valve element then will generally have to have its rate of resistance change as small as less than 1% and its resistance change $\Delta R$ that is small, too. This becomes a primary and large factor that prevents a CPP-GMR device from its practical use.

Therefore, a problem that prevents a conventional spin valve type CPP-GMR device from its practical use is that it is small in resistance change $\Delta R$ and rate of change of magnetic resistance.

The present inventors have discovered that coupling a pair of ferromagnetic layers antiparallel to each other via a nonmagnetic metal layer while using this three-layer structure (SyAF) with different magnitudes of magnetization for a free and/or a fixed layer gives rise to a CPP-GMR device of spin valve type of which $\Delta R$ is large and the rate of change of magnetic resistance is increased to 8% or more and then have reached the present invention.

DISCLOAURE OF THE INVENTION

It is accordingly an object of the present invention to provide a CPP type giant magnetoresistance device that exhibits a giant magnetoresistance effect by spin dependent current in a direction perpendicular to a film plane, and magnetic components and units.

In order to achieve the object mentioned above there is provided in accordance with the present invention in a first aspect thereof as set forth in claim 1, a CPP type giant magnetoresistance device having a ferromagnetic fixed layer, a nonmagnetic conductive layer and a ferromagnetic free layer, characterized in that the said ferromagnetic free layer has a first and a second magnetic layer magnetically coupled together antiparallel to each other via a magnetic coupler and formed to have different magnitudes of magnetization from each other wherein the said first and second magnetic layers are adapted to reverse their magnetizations jointly while maintaining their mutual antiparallel state of magnetization, and CPP-GMR of a CPP type giant magnetoresistance device having said ferromagnetic free layer is larger than CPP-GMR of a CPP type giant magnetoresistance device having a ferromagnetic layer as a ferromagnetic free layer.

In addition to the makeup mentioned above, the device of the present invention as set forth in claim 2 is further characterized in that the said magnetic coupler in the said ferromagnetic free layer forms an interface that is responsive to a spin dependent current of said ferromagnetic fixed layer for scattering spin dependent electrons.

The device of the present invention as set forth in claim 3 is further characterized in that a plurality of such ferromagnetic free layers are laid one upon another to increase its CPPGMR.

The device of the present invention as set forth in claim 4 is further characterized in that the first and second magnetic layers in the said ferromagnetic free layer have an aspect ratio not greater than 2.

The device of the present invention as set forth in claim 5 is further characterized in that, in addition to the makeup mentioned above, the said magnetic copper comprises a nonmagnetic metal or semiconductor layer.

The device of the present invention as set forth in claim 6 is further characterized in that the said magnetic coupler comprises an alloy containing any one or more or of any combination, or a multi-layer of any combination, of ruthenium, iridium, rhodium, rhenium and chromium.

The device of the present invention as set forth in claim 7 is further characterized in that the said magnetic coupler is in the form of a thin film having a film thickness of not greater than 1.5 nm.

The device of the present invention as set forth in claim 8 is further characterized in that the said nonmagnetic conductive layer is made of copper as a material bringing about large spin dependent scattering.

The device of the present invention as set forth in claim 9 is further characterized in that the said ferromagnetic fixed layer is of spin valve type having a ferromagnetic layer and an antiferromagnetic layer placed adjacent thereto.

A CPP type giant magnetoresistance device constructed as mentioned above exhibits a CPP-GMR increased by spin dependent scattering brought about at an interface with the magnetic coupler in the ferromagnetic free layer in accordance with directions of magnetizations of the ferromagnetic fixed and free layers. The CPP type giant magnetoresistance device in this aspect of the present invention can thus have its CPP-GMR extremely increased.

In order to achieve the object mentioned above, there is also provided in accordance with the present invention in a second aspect thereof as set forth in claim 10 a CPP type giant magnetoresistance device having a ferromagnetic fixed layer, a nonmagnetic conductive layer and a ferromagnetic free layer, characterized in that the said ferromagnetic fixed layer has a first and a second magnetic layer magnetically coupled together antiparallel to each other via a magnetic coupler and formed to have different magnitudes of magnetization from each other.

The device in this aspect of the present invention as set forth in claim 11 is further characterized in that the said ferromagnetic free layer has a first and a second magnetic layer magnetically coupled together antiparallel to each other via a magnetic coupler and formed to have different magnitudes of magnetization from each other wherein the said first and second magnetic layers are adapted to reverse their magnetizations jointly while maintaining their mutual antiparallel state of magnetization.

The device in this aspect of the present invention as set forth in claim 12 is further characterized in that the said magnetic coupler comprises a nonmagnetic metal layer made of one or more of ruthenium, iridium, rhodium, rhenium and chromium.

A CPP type giant magnetoresistance device constructed as mentioned above exhibits a CPP-GMR increased by spin dependent scattering brought about at an interface with the magnetic coupler in the ferromagnetic free layer and/or at an interface in the ferromagnetic fixed layer in accordance with directions of magnetizations of the ferromagnetic fixed and free layers. The CPP type giant magnetoresistance device in this aspect of the present invention can thus have its CPP-GMR extremely increased.

In order to achieve the object mentioned above, there is provided in accordance with the present invention in a third aspect thereof as set forth in claim 13 a CPP type giant magnetoresistance device having a ferromagnetic fixed layer, a nonmagnetic conductive layer and a ferromagnetic free layer, characterized in that it has a nonmagnetic metal layer made of one or more of ruthenium, iridium, rhodium, rhenium and chromium between the said ferromagnetic fixed and nonmagnetic conductive layers and/or on a surface of the said ferromagnetic free layer, and CPP-GMR is made larger by providing said nonmagnetic metal layer.

A CPP type giant magnetoresistance device constructed as mentioned above exhibits a CPP-GMR increased by spin dependent scattering brought about at interfaces of the nonmagnetic metal layer with the ferromagnetic fixed layer and with the nonmagnetic conductive layer and/or at an interface between the nonmagnetic metal layer and the ferromagnetic free layer in accordance with directions of magnetizations of the ferromagnetic fixed and free layers. The CPP type giant magnetoresistance device in this aspect of the present invention can thus have its CPP-GMR extremely increased.

In order to achieve the object mentioned above there is provided in accordance with the present invention in a third aspect thereof, a CPP type giant magnetoresistance device having a ferromagnetic fixed layer, a nonmagnetic conductive layer, and a ferromagnetic free layer, characterized in that the said ferromagnetic free layer has a first and a second magnetic layer magnetically coupled together antiparallel to each other via a magnetic coupler and formed to have different magnitudes of magnetization from each other wherein the said first and second magnetic layers are adapted to reverse their magnetizations jointly while maintaining their mutual antiparallel state of magnetization, the first and the second magnetic layers of the ferromagnetic free layer have aspect ratio of 2 or less, and said CPP-GMR is larger than CPP-GMR of the CPP type giant magnetoresistance device having a ferromagnetic free layer as a ferromagnetic layer.

In said aspect, a magnetic coupler in the ferromagnetic free layer preferably forms an interface to scatter the spin dependent electrons based on the spin dependent current of the ferromagnetic fixed layer. Preferably, CPP-GMR is made large by depositing ferromagnetic free layers to multi-layers. The magnetic coupler is preferably either a nonmagnetic metal layer or nonmagnetic conductive layer. The nonmagnetic metal layer is preferably any of ruthenium, iridium, rhodium, rhenium, and chromium, or an alloy of their combination, or their multi-layered deposition. The thickness of the magnetic coupler is preferably 1.5 nm or less. The nonmagnetic conductive layer is preferably cupper to cause large spin dependent scattering. The ferromagnetic fixed layer is preferably a ferromagnetic layer and a spin valve type ferromagnetic fixed layer having an antiferromagnetic layer next thereto.

In the CPP type giant magnetoresistance device of this makeup, spin dependent scattering is caused at the interface of magnetic couplers of a ferromagnetic free layer based on the direction of magnetization of a ferromagnetic fixed layer and a ferromagnetic free layer, and CPP-GMR is realized to increase. Therefore, CPP-GMR can be extremely large in the CPP type giant magnetoresistance device of the present invention.

In order to achieve the object mentioned above, there is also provided in accordance with the present invention in a fourth aspect thereof as set forth in claims 14 and 30 a magnetic component using a CPP type giant magnetoresistance device, characterized by having a CPP type giant magnetoresistance device as mentioned above.

The present invention also provides as set forth in claims 15 and 31, a magnetic head for reading recorded information by detecting a leakage magnetic field from a recording medium, characterized in that it comprises a CPP type giant magnetoresistance device as mentioned above, wherein a said ferromagnetic free layer is adapted to reverse its magnetization in response to a leakage magnetic field from the said recording medium to cause the device to exhibit CPP-GMR based on spin dependent scattering of sensor electrons, thereby detecting a direction of the said leakage magnetic field as a change in resistance.

The magnetic head of the present invention as set forth in claim 16 and 32 is further characterized in that, in addition to the makeup mentioned above, the second magnetic layer in said ferromagnetic free layer has an end face set face to face with the said recording medium for detecting the leakage magnetic field therefrom.

The magnetic head of the present invention as set forth in claim 16 and 33 is further characterized in that a stratal end face of the said ferromagnetic free layer on which its multi-layered structure appears is set face to face with the said recording medium for detecting the leakage magnetic field therefrom.

The magnetic head of the present invention as set forth in claim 16 and 34 is further characterized by comprising an electrode for supplying sensor electrons to the CPP type giant magnetoresistance device, the said electrode also serving as a magnetic shield against the leakage magnetic field from the said recording medium.

Constructed as mentioned above and having a CPP type giant magnetoresistance device incorporated therein, a magnetic component can have an electrical resistance therein varied by the CPP-GMR that the device exhibits and which is increased by spin dependent scattering in the device. The magnetic component of the present invention can thus detect a direction of a magnetic field as a change in electrical resistance.

In order to achieve the object mentioned above there is also provided in accordance with the present invention in a fifth aspect thereof as set forth in claims 19 and 35 a magnetic unit using a CPP type giant magnetoresistance device, characterized by having a CPP type giant magnetoresistance device as mentioned above.

The present invention also provides as set forth in claims 20 and 36, a magnetic recorder characterized in that a CPP type giant magnetoresistance device as mentioned above is arranged to lie at each of intersections of word lines and bit lines to form a nonvolatile storage.

The magnetic recorder of the present invention as set forth in claim 21 and 37 is further characterized in that the said ferromagnetic free layer is adapted to reverse its magnetic field in response to spin injection from each such word line.

A magnetic recorder constructed as mentioned above allows writing or reading by passing a spin dependent current. The magnetic recorder of the present invention provides nonvolatile magnetic storage capability and its operation only requires a spin dependent current to be passed.

BRIEF DESCRIPTION OF THE DRAWINGS

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof. In the drawings.

BEST MODES FOR CARRYING OUT THE INVENTION

Figure 1:
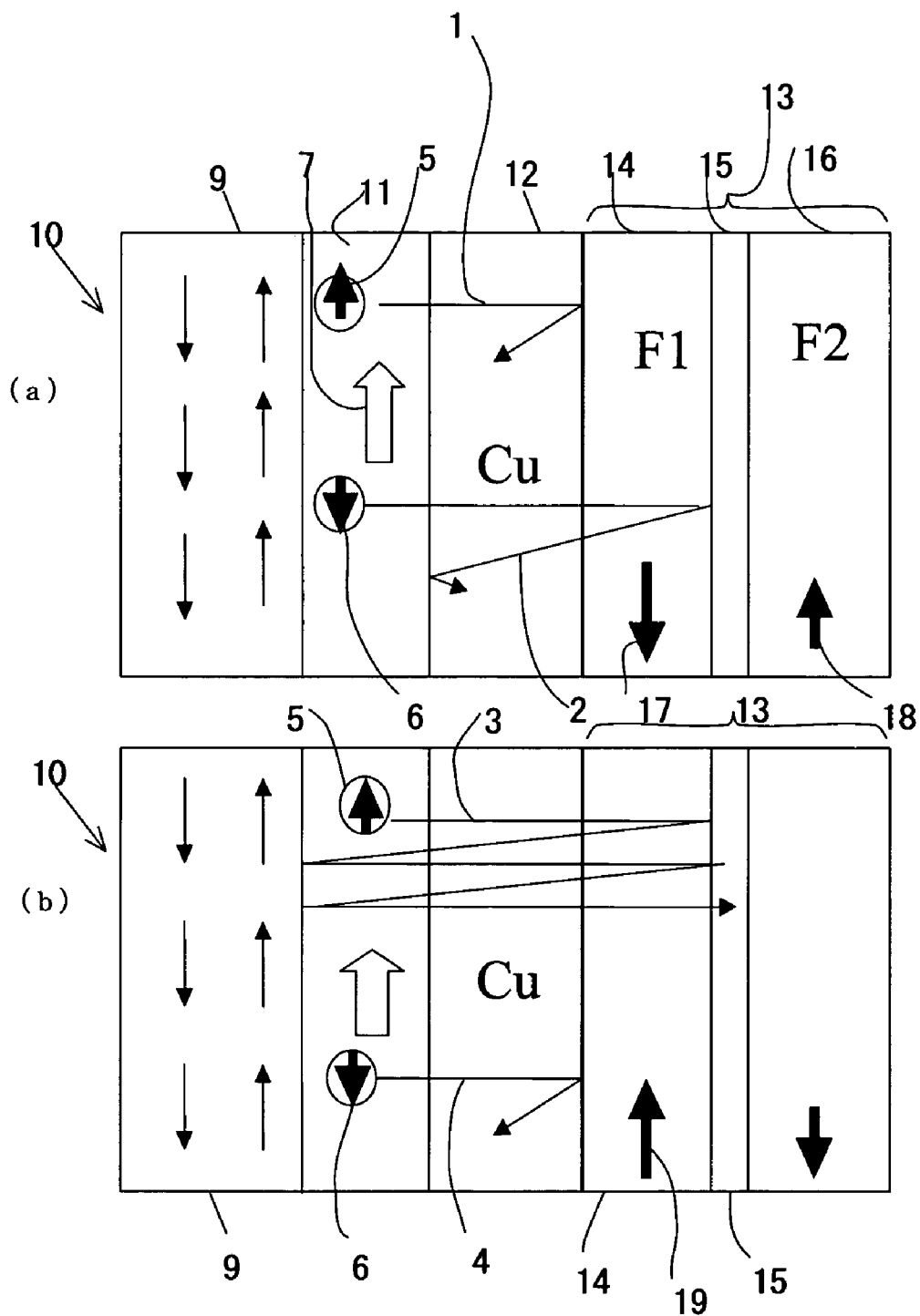
FIG. 1 represents in conceptual views a CPP type giant magnetoresistance device of spin valve type according to a first form of implementation of the present invention wherein a first magnetic layer of SyAF and a fixed layer are magnetized antiparallel and parallel to each other as shown at (a) and (b), respectively.

Hereinafter, the present invention will be described in detail with respect to certain suitable forms of implementation thereof illustrated in FIGS. 1 to 9 wherein identical reference characters are used to designate identical or corresponding components shown and described.

FIG. 1 depicts in conceptual views a CPP type giant magnetoresistance device of spin valve type according to a first form of implementation of the present invention wherein a first magnetic layer in a ferromagnetic free layer and a fixed layer are magnetized antiparallel and parallel to each other as shown at (a) and (b), respectively. As shown in FIG. 1, the CPP type giant magnetoresistance device of the first form of implementation, here designated by reference character 10, has a multi-layered structure of an antiferromagnetic layer 9, a ferromagnetic fixed layer 11, a nonmagnetic conductive layer 12 and a ferromagnetic free layer 13 wherein the ferromagnetic free layer 13 has a first magnetic layer 14 and a second magnetic layer 16 magnetically coupled together antiparallel to each other via a magnetic coupler 15 and formed to have different magnitudes of magnetization $M_1$ and $M_2$, respectively. These layers of the multi-layered structure are formed each having a film thickness of a nanometer size. This nanometer size means a size such that an electron while conserving its momentum and spin is capable of conducting. Thus, inasmuch as electrons in a metal have their mean free path less than 1 μm, it will be seen that spins in a device of this size can, without relaxing, flow from one side into another.

While in this form of implementation the CPP type giant magnetoresistance device of spin valve type includes the antiferromagnetic layer 9 adjacent to the ferromagnetic fixed layer 11 as a fixed layer, the antiferromagnetic layer 9 may be omitted when the ferromagnetic fixed layer 11 is formed of a film having a coercive force large enough for it alone to serve as a fixed layer. The nonmagnetic conductive layer 12 should effectively be a metal layer made of copper (Cu). Cu allows giving rise to much larger spin dependent scattering than the other metals capable of spin dependent scattering.

The ferromagnetic free layer 13 is shown here as having applied thereto or to a free layer, a three-layer structure in which two ferromagnetic layers, namely the first and second magnetic layers 14 and 16, are magnetically coupled together antiparallel to each other via the magnetic coupler 15 and formed to have different magnitudes of magnetization from each other. This three-layer structure according to the present invention will also be referred to hereinafter as "SyAF" that stands for "Synthetic Anti-Ferromagnet". The ferromagnetic free layer 13 may not only be made up of this three-layer structure singly, but also it may comprise a multi-layer of more than one such three-layer structural units to increase the device's CPP-GMR.

The SyAF in this form of implementation is a single domain structure if the aspect ratio: $k \leq 2$ and especially $k=1$, which is extremely small with its flex reversing field not dependent on the device size; hence its magnetization can be reversed by spin injection.

The magnetization of the ferromagnetic free layer 13 is given by difference $\Delta M$ between magnetization $M_1$ of the first magnetic layer 14 and magnetization $M_2$ of the second magnetic layer 16; thus $\Delta M = M_1 - M_2$ where $M_1 > M_2$. If the first and second magnetic layers 14 and 16 are composed of an identical material, then they may be formed to have a difference in film thickness and thereby to make a difference in magnitude of magnetization between them. Magnetizations 17 and 18 of the first and second magnetic layers 14 and 16 are here capable of being jointly reversed e.g., under flux reversing magnetic field applied externally, while maintaining their mutual antiparallel relationship of magnetization.

The magnetic coupler 15 has a function of antiferromagnetic coupling. For example, as a nonmagnetic material a nonmagnetic metal or semiconductor may be used to form the magnetic coupler 15. Specifically, use may be made of one or more of ruthenium (Ru), iridium (Ir), rhodium (Rh), rhenium (Re) and chromium (Cr). More than one of them may be used in the form of a multi-layer or an alloy body to constitute the coupler. In addition, a FeSi alloy and Si as a semiconductor element may be utilized. Also, the magnetic coupler 15 in the form of a layer should preferably have a film thickness as thin as 1.5 nm or less. Forming it in a thin film of 1.5 nm or less brings about strong antiparallel exchange coupling and is thus advantageous.

Mention is next made of the effectiveness of using a SyAF film for the ferromagnetic free layer 13, with reference to an example in which ruthenium is used to form the magnetic coupler 15.

When an electric current is passed in a direction perpendicular to a film plane, with the assumption that an electrode resistance is negligible as small, then the resistance R of SyAF film is given by:

$$R = A + B + C$$

where A is the sum of resistances of magnetic layers each of which is given by [(specific resistance) X (film thickness)], B is the sum of resistances of interfaces, and C is the sum of resistances of antiferromagnetic layers each of which is given by [(specific resistance) X (film thickness)]. Then, the CPP-GMR can be expressed by:

$$\text{CPP-GMR} = \{(A+B)_{AF} - (A+B)_F\} / \{(A+B)_F + C\}$$

Here, subscripts "F" and "AF" mean the magnetizations of the free layer and fixed layers being parallel and antiparallel to each other, respectively. From the above it can be seen that the larger the resistance C excessively than the resistance (A+B), the smaller the CPP-GMR.

When used for the ferromagnetic free layer 13, the SyAF being the three-layer structure will make its resistance larger than a monolayer film but not much as an antiferromagnet. For this reason, with this effect alone it is not expected that the use of a SyAF for a free layer would give rise to an extreme increase in CPP-GMR. The present inventors have found, however, that the CPP-GMR device made with the SyAF used for the ferromagnetic free layer 13 has a CPP-GMR that is increased by 8% or more, or one figure larger, than that which has hitherto be obtained.

While precise operations and effects for this have not yet been clarified, they are considered at least qualitatively as stated below.

As shown in FIG. 1(*a*), let it be assumed that spin conserved electrons are conducting from the left to the right in the Figure in a direction perpendicular to the film plane. Then, an electron 5 as shown with its spin (↑) oriented upwards the same as the magnetization of the fixed layer will, according to the GMR principle, be scattered intensely at the interface between the nonmagnetic conductive layer 12 and the first magnetic layer 14 whose magnetization 17 is opposite in orientation to the spin. On the other hand, an electron 6 as shown with its spin (↓) oriented downwards the same as the magnetization 17 of the first magnetic layer 14 will not be scattered at the interface between the nonmagnetic conductive layer 12 and the first magnetic layer 14 and will be scattered intensely at the interface between the first magnetic layer 14 and the Ruthenium layer 15. Electrons so scattered will then be scattered at the interface between the nonmagnetic conductive layer 12 and the ferromagnetic fixed layer 11. As a result, electrons of these two classes different in pin orientation will have paths of conduction as indicated by refracted lines 1 and 2, respectively, in FIG. 1(*a*).

Now, assume that the magnetizations of the SyAF 13 in the state shown in FIG. 1(*a*) are reversed, e. g., by applying external magnetic field thereto, while maintaining their mutual antiparallel relationship itself. Then, as shown in FIG. 1(*b*) electrons 5 each with its spin oriented upwards (↑) in the fixed layer as is the magnetization 19 of the first magnetic layer 14 will not be scattered at the interface between the nonmagnetic conductive layer 12 and the first magnetic layer 14 and will intensely be scattered at the interface between the first magnetic layer 14 and the Ruthenium layer 15. This is due to the known fact that in the case of a Co/Ru multi-layered film, many spins, here, electrons with upward spins (↑) are intensely scattered more at a Ruthenium interface. See K. Eid, R. Fronk, M. Alhaj, W. P. Pratt, Jr. and J. Bass, "Current-perpendicular-to-plane magneto-resistance properties of Ru and Co/Ru interfaces" J. Appl. Phys. 91, 8102 (2002).

The electrons 5 with upwards spins (↑) which are scattered at the Ruthenium 15 interface will not be scattered at the interface between the ferromagnetic fixed layer 11 and the nonmagnetic conductive layer 12 and will be scattered at the interface between the antiferromagnetic layer 9 and the ferromagnetic fixed layer 11. In the meantime, the electrons 5 whose mean free path is thus long will each be able to make a number of round rips while having its spin conserved. On the other hand, the electrons 6 with downward spins (↓) will, as in FIG. 1(*a*), be scattered at the interface between the nonmagnetic conductive layer 12 and the first magnetic layer 14. The conduction paths of these electrons are indicated by refracted lines 3 and 4 as shown in FIG. 1(*b*).

From comparing the paths of conduction in the states of FIGS. 1(*a*) and 1(*b*), it is seen that the state of FIG. 1(*b*) is lower in resistance. In this way, the CPP-GMR manifests itself. To wit, the CPP-GMR increases due to the presence of Ru. It will therefore be apparent that in this form of implementation, the CPP-GMR is increased by the magnetization reversal of the free layer by 8% or more, one figure larger, than that which has hitherto be obtained.

Mention is next made of a second form of implementation of the present invention.

Figure 2:
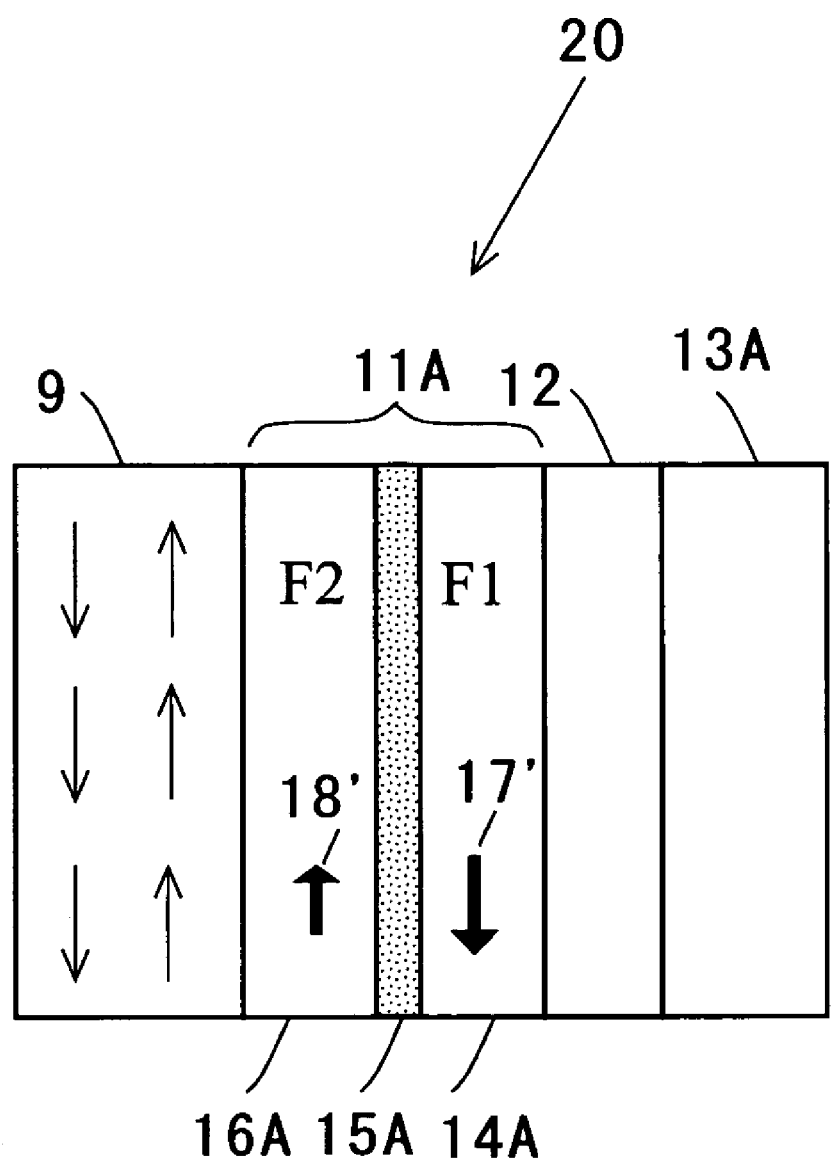
FIG. 2 is a cross sectional view illustrating the makeup of a CPP type giant magnetoresistance device of spin valve type according to a second form of implementation of the present invention.

FIG. 2 is a cross sectional view illustrating the makeup of a CPP type giant magnetoresistance device of spin valve type according to the second form of implementation of the present invention. In FIG. 2, there is shown such a CPP type giant magnetoresistance device 20 according to the second form of implementation, which has a multi-layered structure comprising an antiferromagnetic layer 9, a ferromagnetic fixed layer 11A, a nonmagnetic conductive layer 12 and a ferromagnetic free layer 13A.

In the CPP type giant magnetoresistance device 20 according to the second form of implementation, the ferromagnetic fixed layer 11A has a SyAF structure wherein the ferromagnetic fixed layer 11A has a first magnetic layer 14A and a second magnetic layer 16A which are coupled together magnetically antiparallel to each other via a magnetic coupler 15A and formed to have different magnitudes of magnetization 17' and 18', respectively. These layers of the multi-layered structure are formed each having a film thickness of a nanometer size.

To form the magnetic coupler 15A in the SyAF structure, one or more of ruthenium, iridium, rhodium, rhenium and chromium may be used. More than one of them may be used in the form of a multi-layer or an alloy body to constitute the coupler. In addition, a FeSi alloy and Si as a semiconductor element may be utilized. Also, the magnetic coupler 15A in the form of a layer should preferably have a film thickness as thin as 1.5 nm or less. Forming it in a thin film of 1.5 nm or less brings about strong antiparallel exchange coupling and is thus advantageous.

An increase in CPP-GMR is obtained in the CPP type giant magnetoresistance device 20 of the second form of implementation as in the CPP type giant magnetoresistance device 10 of the first form of implementation.

Formed of the three-layer structure, the ferromagnetic fixed layer 11A may not only be made up of this three-layer structure singly but also may comprise a multi-layer of more than one such three-layer structural units to increase the device's CPP-GMR.

As to the rise in CPP-GMR thus achieved here when the ferromagnetic fixed layer 11A is made in the form of the SyAF structure, precise operations and effects for this have not yet been clarified as for the CPP type giant magnetoresistance device 10 of the first form of implementation. However, they are considered at least qualitatively to be due to the spin dependent scattering at an interface of the magnetic coupler 15A such as of Ru with the nonmagnetic metal layer in the SYAF structure as mentioned in connection with the CPP type giant magnetoresistance device 10 of the first form of implementation.

Mention is next made of a modification of the second form of implementation of the present invention.

Figure 3:
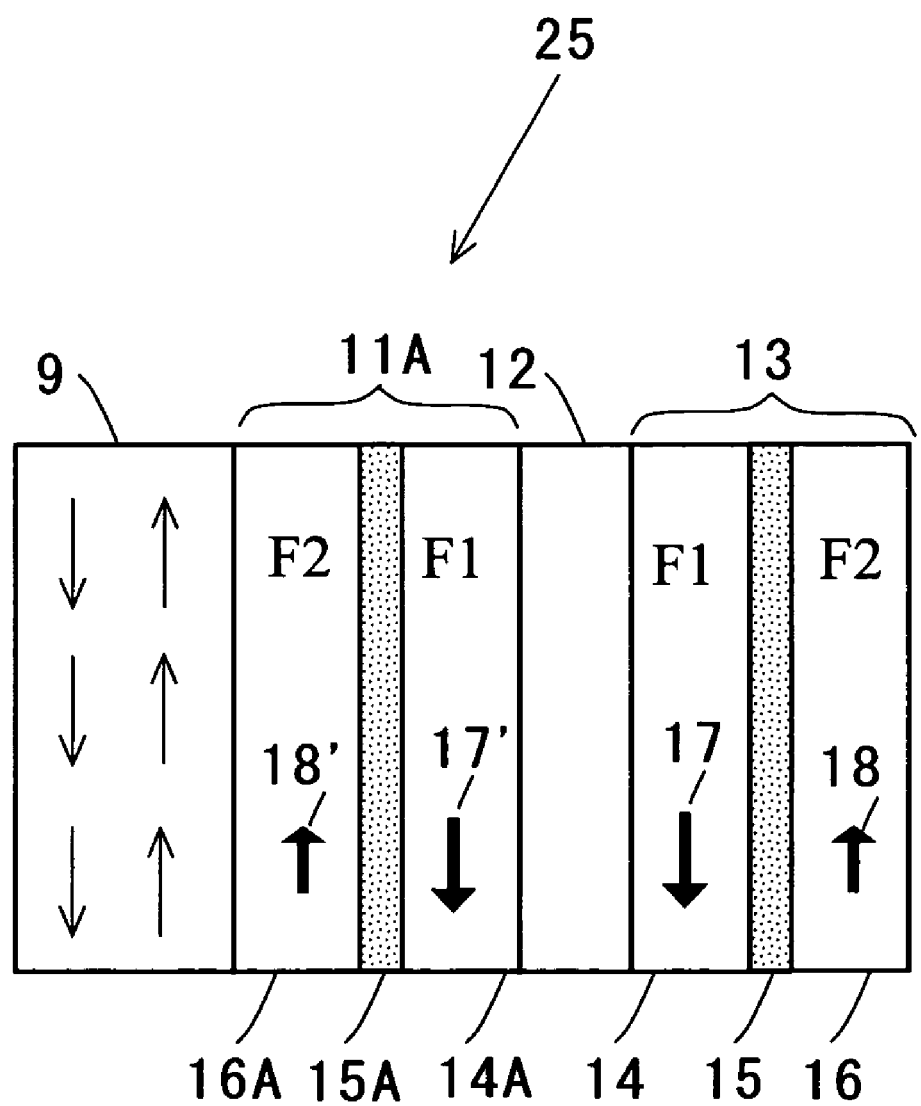
FIG. 3 is a cross sectional view illustrating the makeup of a CPP type giant magnetoresistance device of spin valve type as a modification of the second form of implementation of the present invention.

FIG. 3 is a cross sectional view illustrating the makeup of a CPP type giant magnetoresistance device of spin valve type as a modification of the second form of implementation of the present invention. In FIG. 3, there is shown such a CPP type giant magnetoresistance device 25 that has a multi-layered structure comprising an antiferromagnetic layer 9, a ferromagnetic fixed layer 11A of SyAF structure, a nonmagnetic conductive layer 12 and a ferromagnetic free layer 13 of SYAF structure.

The ferromagnetic free layer of SyAF structure 13 has a first magnetic layer 14 and a second magnetic layer 16 which are coupled together magnetically antiparallel to each other via a magnetic coupler 15 and formed to have different magnitudes of magnetization 17 and 18, respectively. And, the ferromagnetic fixed layer 11A of SyAF structure has a first magnetic layer 14A and a second magnetic layer 16A which are coupled together magnetically antiparallel to each other via a magnetic coupler 15A and formed to have different magnitudes of magnetization 17' and 18', respectively.

These layers of the multi-layered structure are formed each having a film thickness of a nanometer size. Here, to form the magnetic coupler 15, 15A in each SyAF structure, one or more of ruthenium, iridium, rhodium, rhenium and chromium may be used. More than one of them may be used in the form of a multi-layer or an alloy body to constitute the coupler. In addition, a FeSi alloy and Si as a semiconductor element may be utilized. Also, the magnetic coupler 15, 15A in the form of a layer should preferably have a film thickness as thin as 1.5 nm or less. Forming it in a thin film of 1.5 nm or less brings about strong antiparallel exchange coupling and is thus advantageous.

In this CPP type giant magnetoresistance device 25, too, an increase in CPP-GMR is obtained as in the CPP type giant magnetoresistance device 10 of the first form of implementation and the CPP type giant magnetoresistance device 20 of the second form of implementation.

Formed of the three-layer structure, each of the ferromagnetic fixed and free layers 11A and 13 may not only be made up of this three-layer structure singly but also may comprise a multi-layer of more than one such three-layer structural units to increase the device's CPP-GMR.

As to the rise in CPP-GMR thus achieved here when the ferromagnetic free and fixed layers 13 and 11A are each made in the form of the SyAF structure, precise operations and effects for this have not yet been clarified as for the CPP type giant magnetoresistance device 10 of the first form of implementation. However, as mentioned in connection with the CPP type giant magnetoresistance device 10 of the first form of implementation, they are considered at least qualitatively to be due to the spin dependent scattering at an interface of the magnetic coupler 15, 15A such as of Ru with the nonmagnetic metal layer in the SyAF structure forming the ferromagnetic free layer 13 or the ferromagnetic fixed layer 11A.

Mention is next made of a third form of implementation of the present invention.

Figure 4:
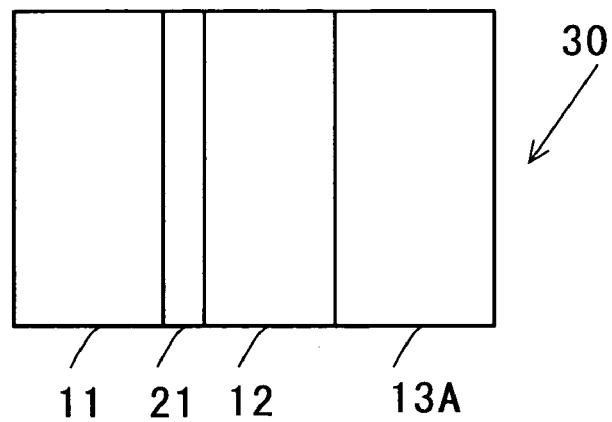
FIG. 4 is a cross sectional view illustrating the makeup of a CPP type giant magnetoresistance device of spin valve type according to a third form of implementation of the present invention.
Figure 4:
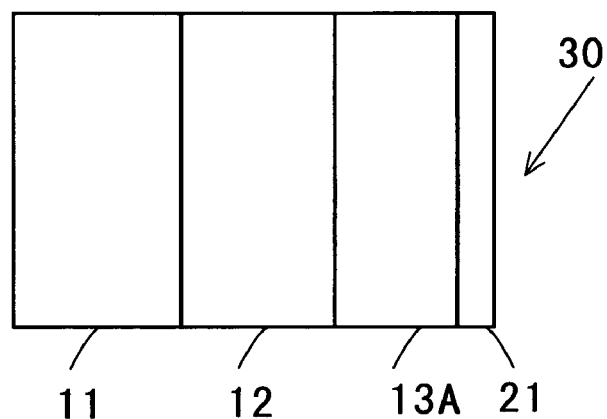
Figure 4:
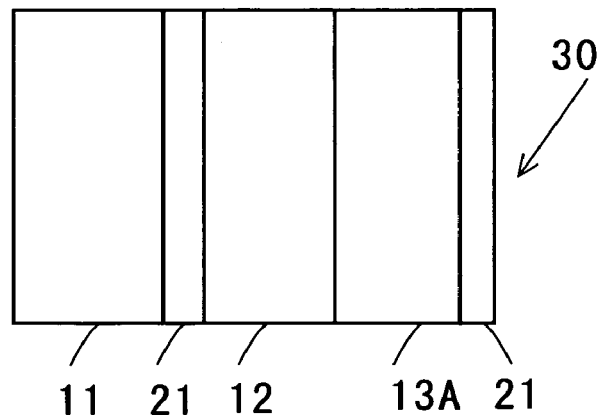

FIG. 4 is a cross sectional view illustrating the makeup of a CPP type giant magnetoresistance device of spin valve type according to a third form of implementation of the present invention. As shown in FIG. 4, such a CPP type giant magnetoresistance device 30 of the third form of implementation has a multi-layered structure comprising a ferromagnetic fixed layer 11, a nonmagnetic conductive layer 12 and a ferromagnetic free layer 13A and may take a structure as shown in FIG. 4(a) in which a nonmagnetic metal layer 21 is formed between the ferromagnetic fixed layer 11 and the nonmagnetic conductive layer 12, a structure as shown in FIG. 4(b) in which a nonmagnetic metal layer 21 is formed on a surface of the ferromagnetic free layer 13A or a structure as shown in FIG. 4(c) in which a nonmagnetic metal layer 21 is formed between the ferromagnetic fixed layer 11 and the nonmagnetic conductive layer 12 and another nonmagnetic metal layer 21 on a surface of the ferromagnetic free layer 13A.

Here, such a nonmagnetic metal layer 21 is a layer made of one or more of ruthenium, iridium, rhodium, rhenium and chromium. These layers of the multi-layered structure are formed each having a film thickness of a nanometer size. And, the nonmagnetic metal layer 21 in each case should preferably have a film thickness as thin as 1.5 nm or less. Also, the structure may further have an antiferromagnetic layer formed on the ferromagnetic fixed layer 11 to make a CPP type giant magnetoresistance device of spin valve type.

In the CPP type giant magnetoresistance device 30 according to the third form of implementation, an increase in CPP-GMR is likewise obtained as in the CPP type giant magnetoresistance device 10 according to the first form of implementation and the CPP type giant magnetoresistance device 20, 25 according to the second form of implementation.

As to the rise in CPP-GMR thus achieved here when a nonmagnetic metal layer 21 is formed between the ferromagnetic fixed layer 11 and the nonmagnetic conductive layer 12 and/or on the ferromagnetic free layer 13A, precise operations and effects for this have not yet been clarified as for the CPP type giant magnetoresistance device 10 of the first form of implementation. However, as mentioned in connection with the CPP type giant magnetoresistance device 10 of the first form of implementation, they are considered at least qualitatively to be due to the spin dependent scattering at interfaces of the nonmagnetic metal layer 21 with the ferromagnetic fixed layer 11 and the nonmagnetic conductive layer 12 and/or at an interface between the nonmagnetic metal layer 21 and the ferromagnetic free layer 13A.

Mention is next made of a fourth form of implementation of the present invention, which relates to a magnetic head with a CPP type giant magnetoresistance device applied thereto.

Figure 5:
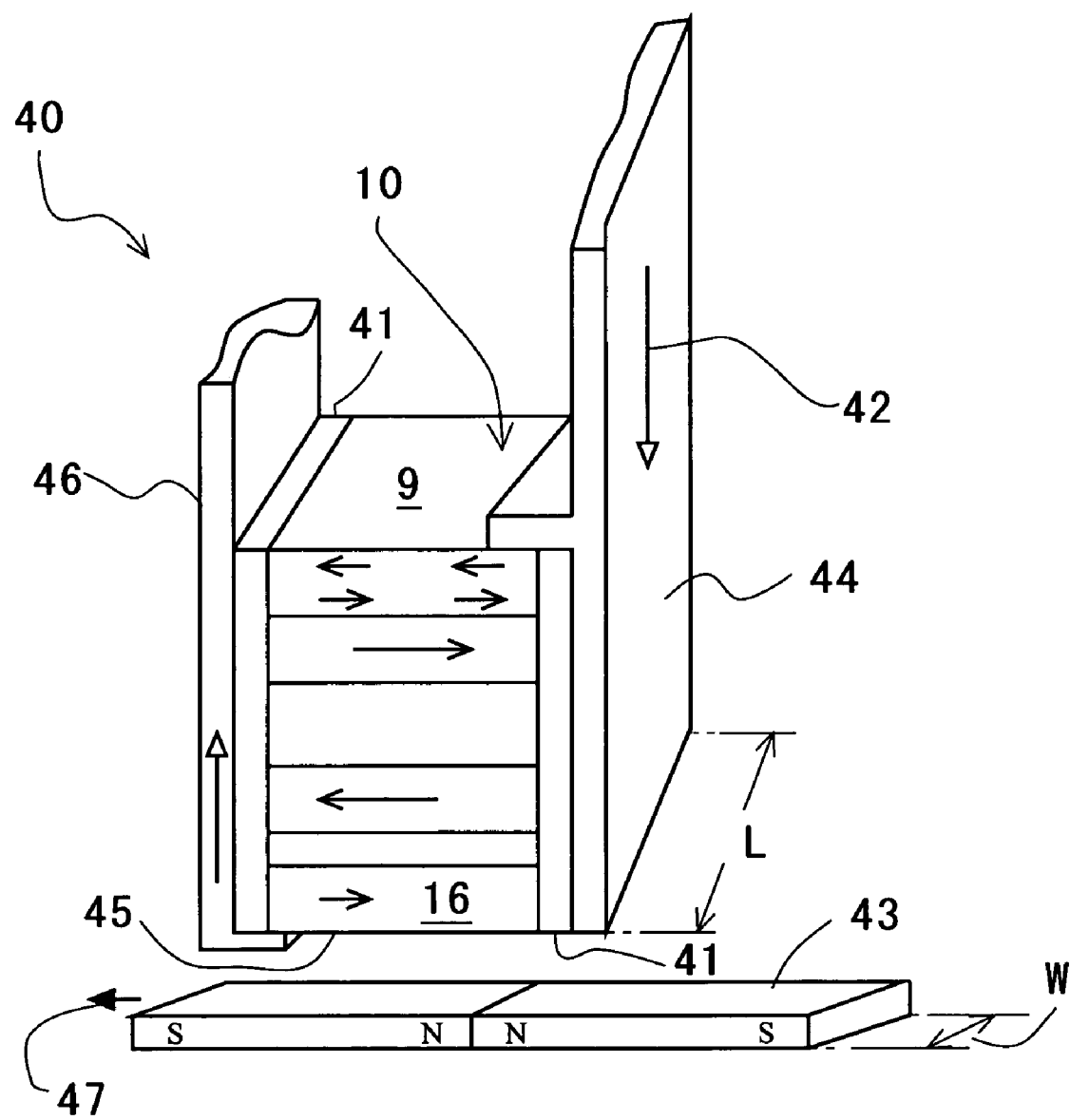
FIG. 5 is a conceptual diagram illustrating a magnetic head according to a fourth form of implementation of the present invention.

FIG. 5 is a conceptual diagram illustrating a magnetic head according to a fourth form of implementation of the present invention. Referring to FIG. 5, such a magnetic head 40 comprises a CPP type giant magnetoresistance device 10, and a first and a second electrode 44 and 46. The CPP-GMR device 10 is shown having an antiferromagnetic layer 9 and a SyAF with a second magnetic layer 16 and has two opposite ends covered with insulating layers 41 and 41. The first electrode 44 is designed to supply spin dependent sensor electrons 42 from the antiferromagnetic layer 9 and also serves as a magnetic shield. The second electrode 46 is disposed in contact with an end face 45 of the second magnetic layer 16 in the SyAF to serve as a magnetic shield, too. A recording medium 43 such as a magnetic disk lies opposed to the end face 45 of the second magnetic layer 16 in the SyAF side of the CCP type giant magnetoresistance device.

Then, although it is desirable to dispose the magnetic head so that a magnetic field to be detected acts parallel to the direction of magnetization of the SyAF, it may be disposed at an angle at which the SyAF is allowed to reverse its magnetization. The insulating layers 41 and 41 may be such as to control the conduction path of sensor electrons to permit their conduction in a direction perpendicular to film planes. The first and second electrodes 44 and 46 of the magnetic head 40 should satisfactorily be not less than the width of the CPP type giant magnetoresistance device and it is satisfactory at least if the magnetic head has a width L that is not more than the track width W of the recording medium. The arrow 47 in FIG. 5 indicates the direction in which the recording medium is moved.

The magnetic head 40 so constructed as mentioned above will have the SyAF caused to reverse its magnetizations in response to a leakage magnetic field from the recording medium to bring about CPP-GMR based on the spin dependent scatterings of sensor electrons and will have its electrical resistance varied thereby. Thus, the magnetic head according to this form of implementation of the invention allows detecting the direction of a magnetic field from the recording medium as a change in electrical resistance. Further, since a magnetic field to be shielded is confined to its width or so, the magnetic head can achieve magnetic shielding even if the recording medium is highly densified.

Figure 6:
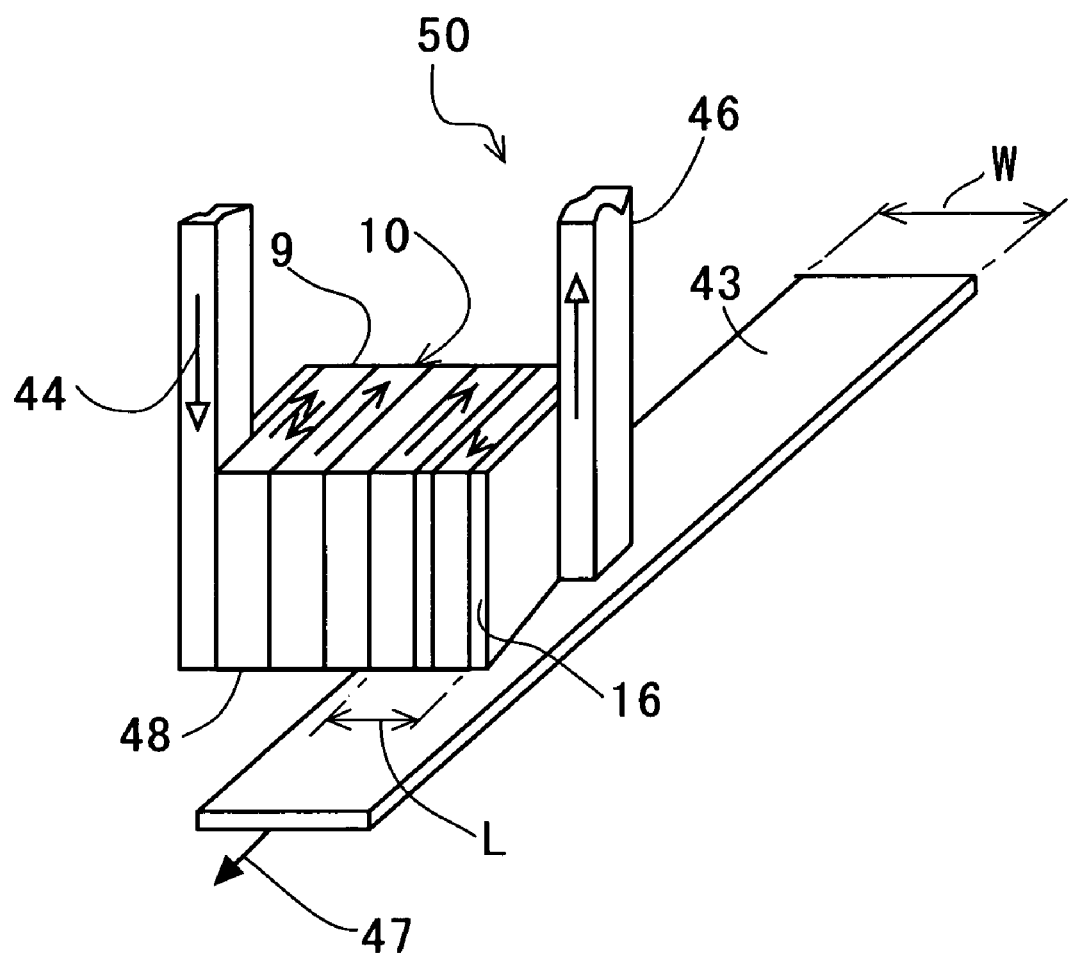
FIG. 6 is a conceptual diagram illustrating another form of implementation of the magnetic head.

Mention is next made of an alternative form of implementation of the magnetic head. FIG. 6 is a conceptual diagram illustrating another form of implementation of the magnetic head. Such a magnetic head 50 shown in FIG. 6 is of the form in which a stratal face 48 of the CPP type giant magnetoresistance device 10, 20, 25 on which its multi-layered structure appears is set face to face with a recording medium 43. It has a first electrode 44 formed in contact with a whole or part surface of the end face of the antiferromagnetic layer 9 and a second electrode 46 formed in contact with a whole or part surface of the end face of the second magnetic layer 16 in the SyAF. In this magnetic head 50, too, magnetic shield layers via insulating layers as shown in connection with the second form of implementation may be provided. While these magnetic shields may serve also as the electrodes, the first and second electrodes 44 and 46 should be insulated from each other. These magnetic shields may each be of any form if it can magnetically shield the SyAF. The magnetic head so constructed makes it possible to detect a magnetic field from the recording medium having a track width W of a size of the width L of the SyAF and can make reproductions even from a highly densified recording medium.

While the fourth and its modified forms of implementation have been described as applied to a magnetic head, a CPP type giant magnetoresistance device according to the present invention can widely be utilized in what can be called magnetic components such as a field sensor, an angle sensor and an angular displacement sensor.

Mention is next made of a fifth form of implementation of the present invention.

Figure 7:
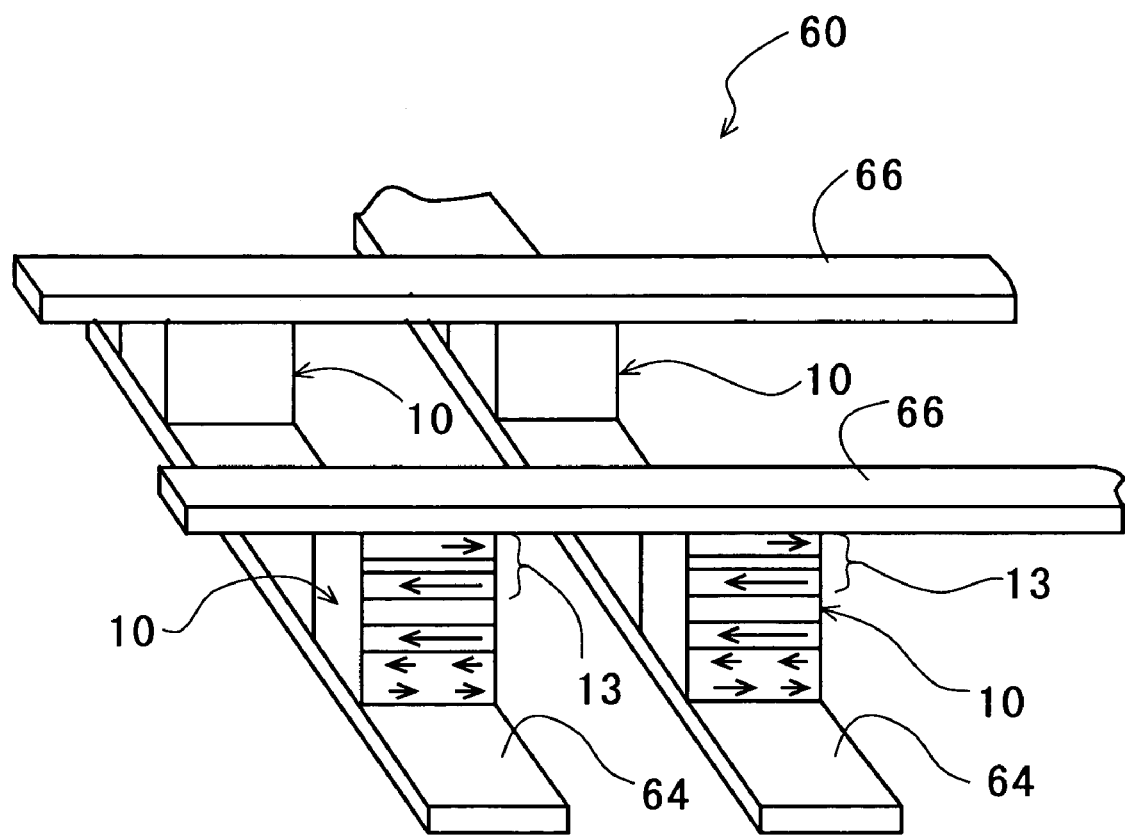
FIG. 7 is a conceptual diagram illustrating a magnetic recorder according to a fifth form of implementation of the present invention.

FIG. 7 is a conceptual diagram illustrating a magnetic recorder capable of storing information to which a CPP type giant magnetoresistance device of the invention is applied. In FIG. 7 there is shown a structure in which a CPP type giant magnetoresistance device 10, 20, 25 is disposed at each of intersections of word lines 64 and bit lines 66. Since the magnetic field which the SyAF 13 of the invention requires to reverse its magnetizations is extremely small, passing an electric current of several milliamperes or so, e.g., 5 mA, for spin injection is sufficient to cause the SyAF 13 to reverse its magnetizations.

In the magnetic recorder so constructed as mentioned above, writing is performed by selecting a CPP type giant magnetoresistance device from a combination of a word and a bit lines and passing an electric current, e.g., of 5 mA, from the word line for spin injection to reverse magnetizations of the SyAF therein. For reading, a CPP type giant magnetoresistance device is selected and from its word line an electric current of, e.g., 1 mA, that is smaller than that required for writing is passed to develop CPP-GMR by spin dependent electron scattering and then to determine a change in resistance of the CPP type magnetoresistance device or whether the resistance is large or small.

Thus, in the magnetic recorder according to the present invention, information units "1" and "0" can be determined depending on whether the fixed and free layers are magnetized parallel and antiparallel to each other, and causing the free layer to remain magnetized after the current supply is cut off allows forming a MRAM as a nonvolatile memory.

While the fifth and its modified forms of implementation have been described as applied to a particular magnetic recorder, it should be understood that the present invention in this aspect is applicable to various magnetic devices such as a digital CTR in which CPP type giant magnetoresistance devices or elements of the invention are applied to a magnetic head as well as a variety of magnetic recording devices such as a hard disk drive (HDD).

Specific Examples of the present invention are given below.

Figure 8:
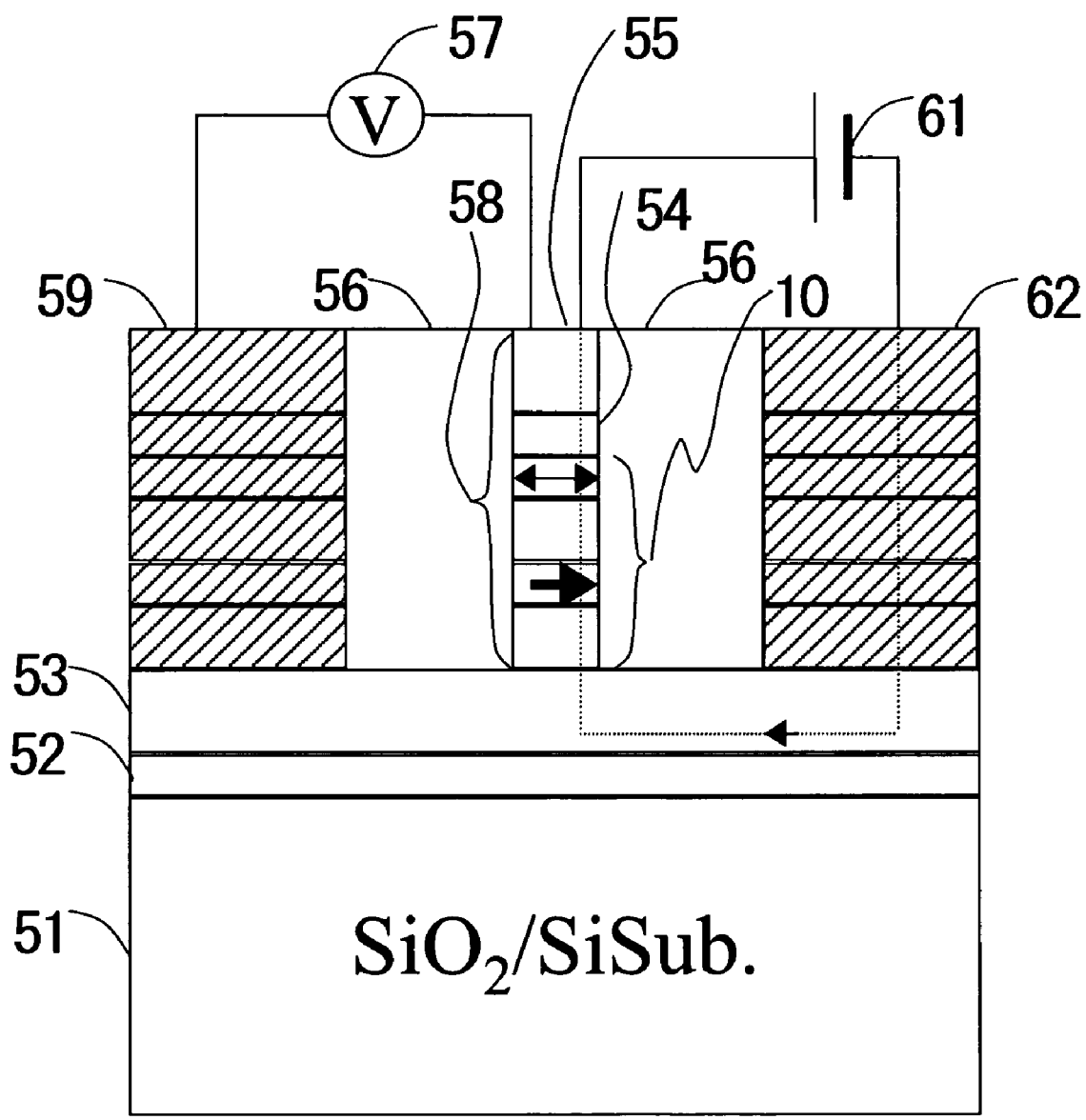
FIG. 8 is a diagrammatic view illustrating the first form of implementation of the invention and a four terminal technique used in connection therewith.
Figure 9:
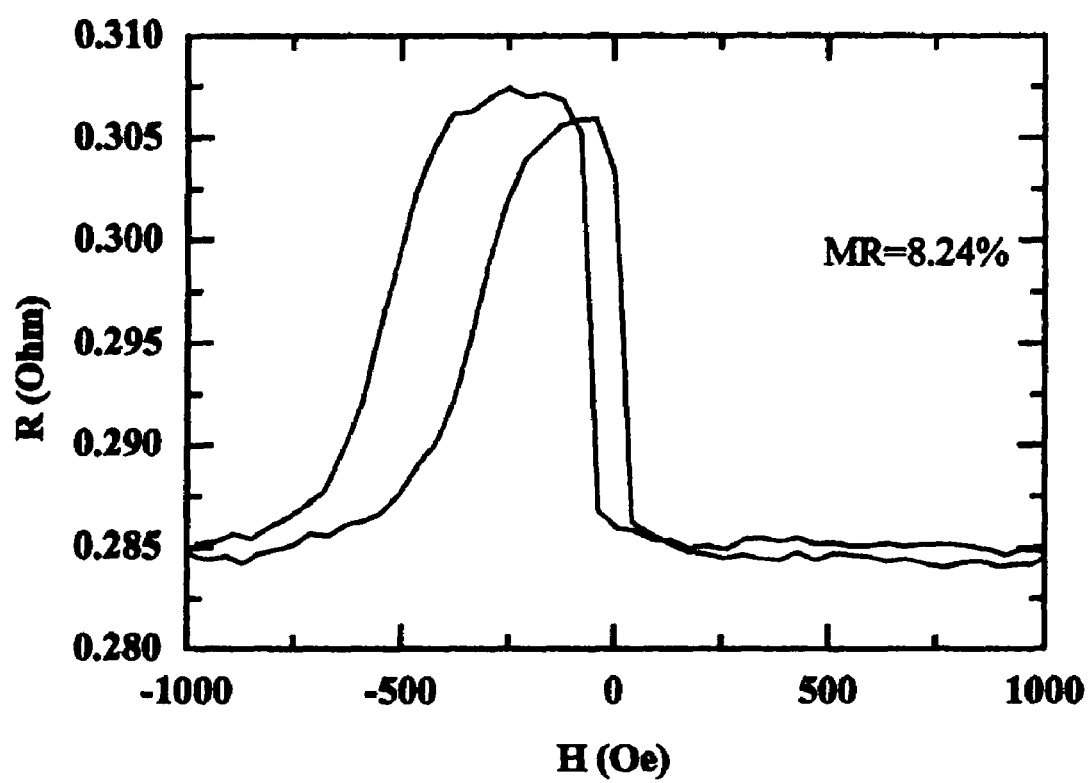
FIG. 9 is a graph depicting CPP-GMR curves obtained in the first form of implementation of the invention.
Figure 10:
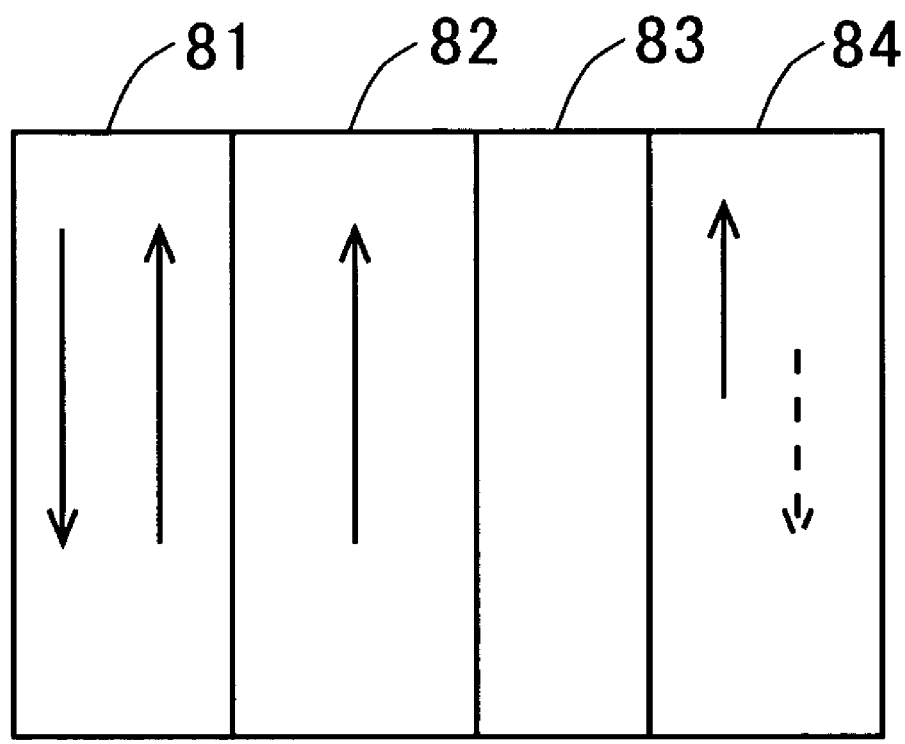
FIG. 10 is a diagrammatic view illustrating a conventional CPP-GMR device.

FIG. 8 is a diagrammatic view illustrating a CPP type giant magnetoresistance device according to the first form of implementation of the invention and a four terminal technique used to determine its properties. For this first Example, use is made of a CPP-GMR structure corresponding to that shown in FIG. 1. As shown in FIG. 8, a thermally oxidized silicon substrate 51 has a lower electrode 52 and a lower, highly conductive layer 53 laid thereon, and mounted on the latter the first Example has a CPP-GMR structure 58 in which are successively multi-layered a CPP type magnetoresistance device 10 as a multi-layered structure of an antiferromagnetic layer, a ferromagnetic fixed layer, a nonmagnetic conductive layer and SyAF, an upper electrode 54 and an upper highly conductive layer 55. The first Example is further provided with insulating layers 56 and 56 for insulating the CPP-GMR structure 58, a voltmeter 57 for sensing a signal voltage, a first electrode 59, a power supply 61 for supplying sense electrons and a second electrode 62.

The CPP-GMR structure 58 was prepared as stated below.

First, using an utrahigh vacuum sputtering apparatus, the thermally oxidized Si substrate had successively multi-layered thereon, Ta (10 nm), Cu (2.5 nm), IrMn (10 nm), $Co_{90}Fe_{10}$ (3 nm), Cu (2.5 nm), $Co_{90}Fe_{10}$ (5 nm), Ru (0.45 nm), $Co_{90}Fe_{10}$ (3 nm) and Ta (5 nm).

Here, film thicknesses are indicated in parentheses. Lower Ta (10 nm), IrMn and upper Ta (5 nm) form the lower electrode, the antiferromagnetic layer and the upper electrode, respectively. $Co_{90}Fe_{10}$ (5 nm), Ru (0.45 nm) and $Co_{90}Fe_{10}$ (3 nm) form the SyAF in which Ru magnetically couples two $Co_{90}Fe_{10}$ magnetic layers together antiparallel to each other. The $Co_{90}Fe_{10}$ (3 nm) in contact with IrMn has spins fixed therein, thus constituting the fixed layer.

Then, using electron beam lithography and Ar ion milling, these films were micromachined to prepare a CPP-GMR device having a sectional structure as shown in FIG. 8. The device had a size of 1×0.5 µm².

For this CPP-GMR device was used the four terminal technique shown in FIG. 8 whereby an electric current of 1 mA was passed between the upper highly conductive layer and the second electrode, and resistance was measured at room temperature under magnetic field of varying strength. Measurement results are shown as a function of magnetic field in FIG. 9, from which it is seen that resistance change $\Delta R=0.023\Omega$ and CPP-GMR is 8.24%. This value of GMR is found to be about 10 (ten) times as large as that of the conventional CPP-GMR device without a SyAF free layer.

Next, a second Example was performed in which as in the first Example, films of Ta (10 nm), Cu (20 nm), IrMn (10 nm), $Co_{90}Fe_{10}$ (3 nm), Cu (6 nm), $Co_{90}Fe_{10}$ (3 nm), Ru (0.45 nm), $Co_{90}Fe_{10}$ (5 nm), Ta (3 nm) and Cu (50 nm) were formed on a thermally oxidized Si substrate.

These films were micromachined using electron beam lithography and Ar ion milling, to prepare a CPP-GMR device having a sectional structure as shown in FIG. 8. The device had a size of 0.5×0.5 µm².

For this device was used the four terminal technique shown in FIG. 8 whereby an electric current of 1 mA was passed between the upper highly conductive layer and the second electrode, and resistance was measured under magnetic field of varying strength. From results of the measurement, it was found that resistance change $\Delta R=0.5\Omega$ and CPP-GMR is 6.6%. This value of CPP-GMR is found to be about 10 (ten) times as large as that of the conventional CPP-GMR device without a SyAF free layer.

A comparative example is given below.

The comparative example was carried out in the same way as the first Example except that $Co_{90}Fe_{10}$ (3 nm), Ru (0.45 nm) and $Co_{90}Fe_{10}$ (5 nm) were replaced by $Co_{90}Fe_{10}$ (8 nm) to prepare a conventional CPP-GMR device.

As in the first Example the CPP-GMR was measured and determined to be 0.5%, which amounts to 1/10 or less of the value in the first Example.

INDUSTRIAL APPLICABILITY

As will be appreciated from the foregoing description, the present invention provides a CPP type giant magnetoresistance device which is extremely large in CPP-GMR and hence can be used to detect the direction of a magnetic field such as from a recording medium as a large change in electrical resistance and can be applied to what are called magnetic components such as a magnetic field sensor, an angle sensor and an angular displacement sensor.

The present invention further provides a magnetic device or unit which, having the capability of writing or reading upon passing spin dependent current while having nonvolatile magnetic storage capability, can be used in a variety of types of magnetic recorders such as a digital VTR and a hard disk drive (HDD), and also in a MRAM.

What is claimed is:

1. A CPP type giant magnetoresistance device having a ferromagnetic fixed layer, a nonmagnetic conductive layer and a ferromagnetic free layer, characterized in that:
    said ferromagnetic free layer has a first and a second magnetic layer magnetically coupled together antiparallel to each other via a magnetic coupler and formed to have different magnitudes of magnetization from each other wherein said first and second magnetic layers are adapted to reverse their magnetizations jointly while maintaining their mutual antiparallel state of magnetization, and CPP-GMR of said CPP type giant magnetoresistance device having said ferromagnetic free layer is larger than CPP-GMR of the CPP type giant magnetoresistance device having a ferromagnetic layer as said ferromagnetic free layer.

2. The CPP type giant magnetoresistance device as set forth in claim 1, characterized in that said magnetic coupler in said ferromagnetic free layer forms an interface that is responsive to a spin dependent current of said ferromagnetic fixed layer for scattering spin dependent electrons.

3. The CPP type giant magnetoresistance device as set forth in claim 1, characterized in that a plurality of such ferromagnetic free layers are laid one upon another to increase its CPP-GMR.

4. The CPP type giant magnetoresistance device as set forth in claim 1, characterized in that the first and second magnetic layers in said ferromagnetic free layer have an aspect ratio not greater than 2.

5. The CPP type giant magnetoresistance device as set forth in claim 1, characterized in that said magnetic coupler comprises a nonmagnetic metal or semiconductor layer.

6. The CPP type giant magnetoresistance device as set forth in claim 1, characterized in that said magnetic coupler comprises an alloy containing any one or more or of any combination, or a multi-layer of any combination, of ruthenium, iridium, rhodium, rhenium and chromium.

7. The CPP type giant magnetoresistance device as set forth in claim 1, characterized in that said magnetic coupler is in the form of a thin film having a film thickness of not greater than 1.5 nm.

8. The CPP type giant magnetoresistance device as set forth in claim 1, characterized in that said nonmagnetic conductive layer is made of copper as a material bringing about large spin dependent scattering.

9. The CPP type giant magnetoresistance device as set forth in claim 1, characterized in that said ferromagnetic fixed layer is of spin valve type having a ferromagnetic layer and an antiferromagnetic layer placed adjacent thereto.

10. A magnetic component using a CPP type giant magnetoresistance device, characterized by having a CPP type giant magnetoresistance device as set forth in claim 1.

11. A magnetic head for reading recorded information by detecting a leakage magnetic field from a recording medium, characterized in that:
it comprises a CPP type giant magnetoresistance device as set forth in claim 1, wherein a said ferromagnetic free layer is adapted to reverse its magnetization in response to a leakage magnetic field from said recording medium to cause the device to exhibit CPP-GMR based on spin dependent scattering of sensor electrons, thereby detecting a direction of a magnetic field from said recording medium as a change in resistance.

12. The magnetic head as set forth in claim 11, characterized in that the second magnetic layer in said ferromagnetic free layer has an end face set face to face with said recording medium for detecting the leakage magnetic field therefrom.

13. The magnetic head as set forth in claim 12, wherein said ferromagnetic free layer has a stratal end face on which its multi-layered structure appears, characterized in that said stratal end face is set face to face with said recording medium for detecting the leakage magnetic field therefrom.

14. The magnetic head as set forth in claim 11, characterized by further comprising an electrode for supplying sensor electrons to the CPP type giant magnetoresistance device, said electrode also serving as a magnetic shield against the leakage magnetic field from said recording medium.

15. A magnetic unit using a CPP type giant magnetoresistance device, characterized by having a CPP type giant magnetoresistance device as set forth in claim 1.

16. A magnetic recorder characterized in that a CPP type giant magnetoresistance device as set forth in claim 1 is arranged to lie at each of intersections of word lines and bit lines to form a nonvolatile storage.

17. The magnetic recorder as set forth in claim 16, characterized in that said ferromagnetic free layer is adapted to reverse its magnetization in response to spin injection from each such word line.

18. A CPP type giant magnetoresistance device, characterized in that;
in said CPP type giant magnetoresistance device having a ferromagnetic fixed layer, a nonmagnetic conductive layer, and a ferromagnetic free layer, said ferromagnetic free layer has a first and a second magnetic layer magnetically coupled together antiparallel to each other via a magnetic coupler and formed to have different magnitudes of magnetization from each other wherein the said first and second magnetic layers are adapted to reverse their magnetizations jointly while maintaining their mutual antiparallel state of magnetization, the first and the second magnetic layers of said ferromagnetic free layer have aspect ratio of 2 or less, and said CPP-GMR is larger than CPP-GMR of the CPP type giant magnetoresistance device having a ferromagnetic free layer as a ferromagnetic layer.

19. The CPP type giant magnetoresistance device as set forth in claim 18, characterized in that the magnetic coupler in said ferromagnetic free layer forms the interface to scatter spin dependent electrons based on the spin dependent current of said ferromagnetic fixed layer.

20. The CPP type giant magnetoresistance device as set forth in claim 18, characterized in that CPP-GMR is made large by depositing said ferromagnetic free layers to multilayers.

21. The CPP type giant magnetoresistance device as set forth in claim 18, characterized in that said magnetic coupler is either a nonmagnetic metal layer or a nonmagnetic conductive layer.

22. The CPP type giant magnetoresistance device as set forth in claim 21, characterized in that said nonmagnetic metal layer is any of ruthenium, iridium, rhodium, rhenium, and chromium, or an alloy of their combination, or their multi-layered deposition.

23. The CPP type giant magnetoresistance device as set forth in claim 18, characterized in that the thickness of said magnetic coupler is 1.5 nm or less.

24. A CPP type giant magnetoresistance device as set forth in claim 18, characterized in that said nonmagnetic conductive layer is copper to cause large spin dependent scattering.

25. A CPP type giant magnetoresistance device as set forth in claim 18, characterized in that said ferromagnetic fixed layer is a spin valve type ferromagnetic fixed layer having a ferromagnetic layer and an antiferromagnetic layer next thereto.

* * * * *